United States Patent [19]
Cottet et al.

[11] Patent Number: 5,363,551
[45] Date of Patent: Nov. 15, 1994

[54] METHOD AND APPARATUS FOR MOUNTING COMPONENTS WITH ANGLED TERMINALS

[75] Inventors: Jacques Cottet, Viuz En Sallaz; Serge Servoz, Lugrin, both of France

[73] Assignee: Amphenol Socapex, France

[21] Appl. No.: 103,039

[22] Filed: Jul. 28, 1993

[30] Foreign Application Priority Data

Jul. 31, 1992 [FR] France ................. 92 09576

[51] Int. Cl.$^5$ ............................................ H05K 3/32
[52] U.S. Cl. ........................................ 29/837; 29/741; 29/759
[58] Field of Search .............. 29/739, 741, 758, 759, 29/760, 827, 832, 837, 884; 140/147; 174/138 G

[56] References Cited

U.S. PATENT DOCUMENTS

| | | | |
|---|---|---|---|
| 3,449,813 | 6/1969 | Tregubenko | 29/837 X |
| 4,211,001 | 7/1980 | White et al. | 29/837 X |
| 4,488,581 | 12/1984 | Stumpf et al. | 140/147 |
| 4,543,713 | 10/1985 | Rapp | 29/741 X |
| 4,611,399 | 9/1986 | Tavares et al. | 29/876 |
| 4,739,550 | 4/1988 | Schaeffer et al. | 29/741 |

FOREIGN PATENT DOCUMENTS

| | | | |
|---|---|---|---|
| 224455 | 7/1985 | Germany | 29/759 |
| 2220383 | 9/1990 | Japan | 29/837 |
| 1275604 | 12/1986 | U.S.S.R. | 29/759 |
| 1706070 | 1/1992 | U.S.S.R. | 29/759 |

*Primary Examiner*—Peter Dungba Vo
*Attorney, Agent, or Firm*—Bacon & Thomas

[57] ABSTRACT

The invention relates to mounting components having angled terminals, in particular connectors, on a printed circuit card. The mounting apparatus comprises a guide part for guiding the ends of the angled terminals. This part is in the form of a comb having teeth that delimit slots through which the terminals pass. The teeth are provided with orifices in alignment along a Y direction perpendicular to the X direction of the teeth. The orifices are designed to receive rods on a temporary basis.

7 Claims, 4 Drawing Sheets

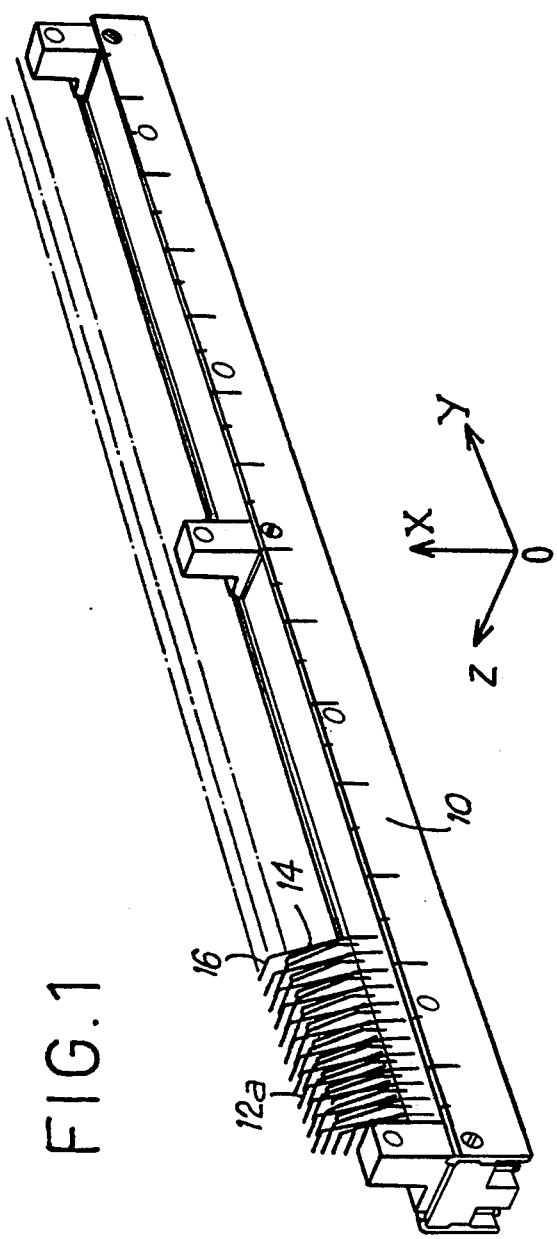
FIG.1
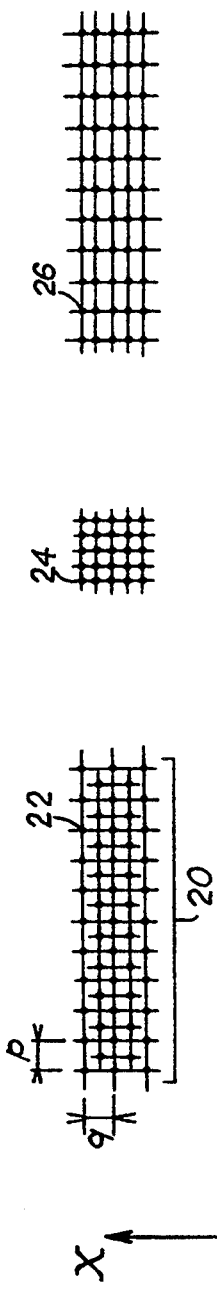
FIG.2c
FIG.2b
FIG.2a

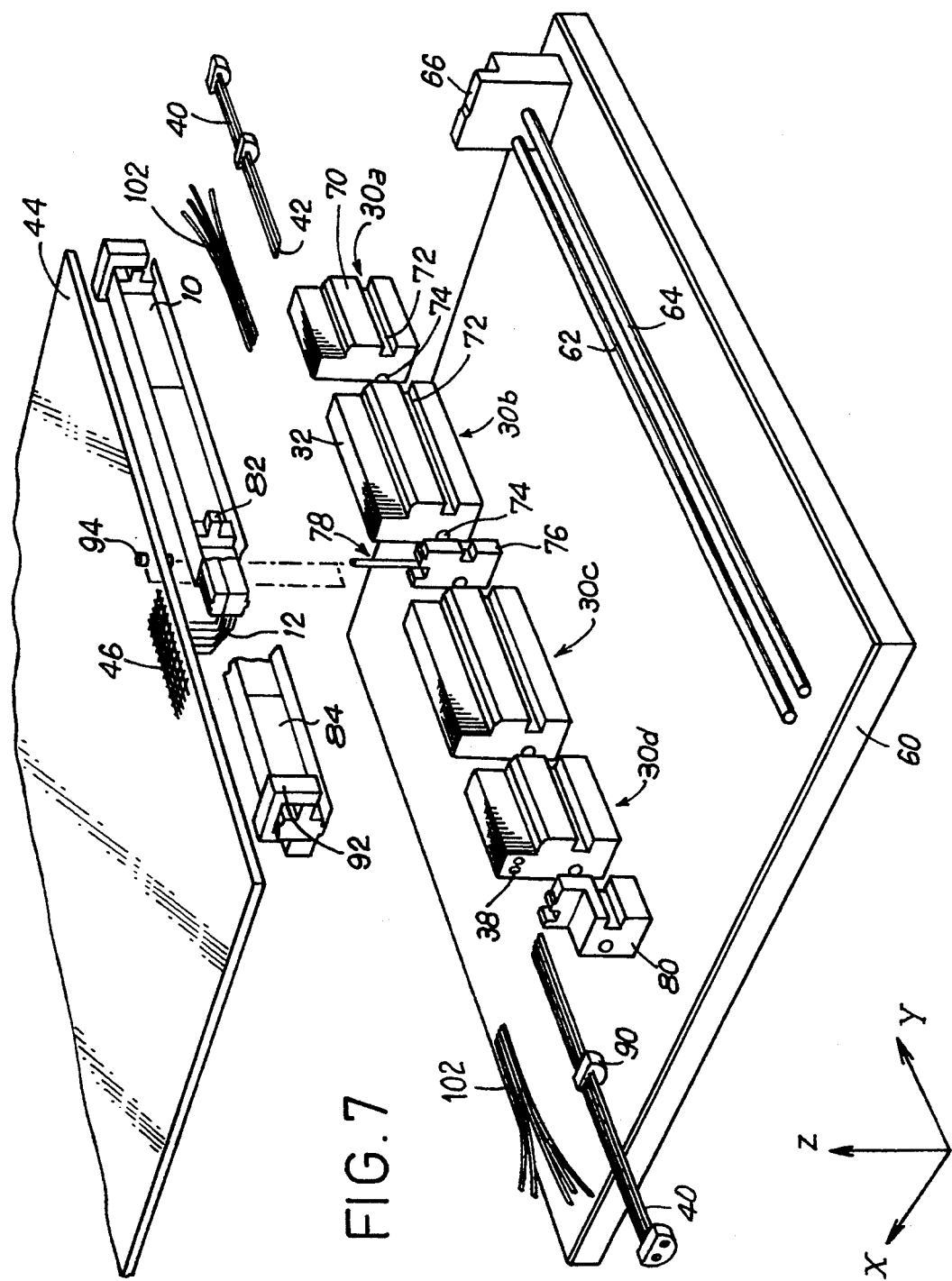

METHOD AND APPARATUS FOR MOUNTING COMPONENTS WITH ANGLED TERMINALS

FIELD OF THE INVENTION

The present invention relates to a method and to apparatus for mounting components having angled contact terminals in plated-through holes in a printed card.

The mounting of the component on a printed card by inserting its contact terminals in plated-through holes of the card before the terminals are soldered is becoming an operation that is particularly difficult because of the ever-increasing miniaturization of components, the significant increase in the number of terminals and in terminal density, and the reduction in terminal section that simultaneously reduces terminal stiffness.

One of the most difficult components to mount on a printed card is a connector designed for mounting on a daughter card, such a connector including angled contact terminals designed to be inserted in tinned holes in the daughter card, and having contacts located in the vicinity of one of the edges of the card that are very numerous and very close to one another.

BACKGROUND OF THE INVENTION

FIG. 1 shows a connector having angled contact terminals. It comprises an elongate body 10 designed to be fixed on an edge of the printed card. The body 10 has contact terminals passing through it, which terminals are constituted by electrical conductors represented in the figure by their free ends 12a for insertion in the plated-through holes of the card. As can be seen, the contact terminals are angled, i.e. each of them includes a first portion 14 which is substantially perpendicular to the face of the body 10 (axis OX) and a right-angled portion 16 substantially parallel to the body 10 of the connector (axis OZ).

As can be seen, the various contact terminals 12 are disposed in planes perpendicular to the length of the connector body 10.

FIGS. 2a to 2c show various possible configurations of plated-through holes formed in a printed circuit card and given an overall reference 20.

In FIG. 2a, the plated-through holes 22 are in a staggered configuration. They are distributed in staggered rows parallel to the Y direction and in columns parallel to the X direction. The pitch between two consecutive plated-through holes is equal to p in the Y direction and it is equal to q in the X direction.

FIG. 2b shows a square disposition of plated-through holes 24, and FIG. 2c shows a rectangular disposition of plated-through holes 26.

As can be seen, in all configurations the plated-through holes 22, 24, or 26 are disposed overall along rows Y and columns X. The ends 12a of the contact terminals of the connector must naturally reproduce the same geometrical configuration as the plated-through holes 22, 24, or 26.

It will easily be understood that when the plated-through hole pitches q and p and thus the pitches of the ends of the contact terminals 12a are small, it is difficult or even impossible to insert the contact terminals directly into the plated-through holes because of the relative flexibility of the ends and because of tolerances in their relative positioning.

To solve that problem, French patent No. 2 605 175 in the name of the Assignee already describes tooling enabling the ends of the contact terminals to be guided so as to facilitate insertion thereof in the plated-through holes.

The tooling described in that patent is very well adapted to components or connectors having straight terminals, i.e. typically connectors to be mounted on a mother board which, in addition, generally has no other components.

Unfortunately, the tooling is not well adapted to components or connectors having angled terminals as shown in FIG. 1, i.e. typically connectors for mounting on daughter cards which are generally already fitted with various electronic components when it comes to mounting the connector on the card.

OBJECTS AND SUMMARY OF THE INVENTION

An object of the present invention is to provide a mounting apparatus and a mounting method enabling the ends of angled contact terminals of components or connectors to be guided into plated-through holes in a printed card, even if other components are already fixed on the printed card.

To achieve this object, the present invention provides a mounting apparatus for mounting angled terminals of electronic components in plated-through holes of a printed card, the ends of the terminals being disposed in a regular arrangement of parallel rows and columns, said terminals extending in the column direction, the apparatus comprising:

a comb-forming guide assembly constituted by a plurality of mutually parallel teeth defining slots between one another, each slot being suitable for receiving terminals in a same column, each tooth being provided with a plurality of orifices, and corresponding orifices being in alignment in the row direction; and a plurality of elongate elements, each elongate element being suitable for being inserted into the orifices of the teeth that are disposed on the same row, each elongate element being disposed between a terminal of one column and an adjacent terminal in the same column, whereby the end of each terminal is surrounded, when all of said terminals are installed in said device, by portions of two adjacent teeth and by portions of two adjacent elongate elements.

It will readily be understood that with such mounting apparatus, the space occupied by the mounting assembly is substantially equal to the area of the zone including the plated-through holes. Mounting can therefore be performed even if electronic components have already been fixed on the printed card.

In addition, it will be understood that because of the removable nature of the elongate elements, it is possible to extract them to displace the entire component perpendicularly to the plane of the card so as to cause the ends of the contact terminals to penetrate fully into the plated-through holes, thereby correctly positioning the connector or component relative to said card.

The guide assembly preferably includes a plurality of comb-forming modular assemblies that can be associated with one another to adapt the length of the assembly in the row direction to the size of the component that is to be mounted on the printed card.

Apparatus is thus obtained which is capable of adapting to components of different lengths, providing the pitches of the ends of the contact terminals in the row direction and in the column direction remain the same.

The invention also provides a method of mounting an electronic component having a plurality of angled terminals onto a printed card having plated-through holes, the ends of said angled terminals being disposed in a regular disposition of parallel rows and columns, said terminals extending in the column direction and being intended to be received in respective ones of said holes, the method comprising the following steps:

terminals disposed in the same columns are disposed in corresponding parallel slots of a guide assembly, said slots being separated by parallel teeth, the terminals being disposed in such a manner that the ends of the terminals project beyond the ends of said teeth;

elongate elements are inserted in a plurality of aligned orifices formed in said teeth, in such a manner as to ensure that said elongate elements separate the ends of adjacent terminals in the same column;

said guide assembly is positioned relative to said card in such a manner that said terminal ends penetrate at least in part into said plated-through holes;

said elongate elements are withdrawn from said orifices;

said card is displaced relative to said component perpendicular to the plane of said card so as to cause the ends of said terminals to penetrate fully into said plated-through holes;

the card is secured to said component; and said mounting assembly is separated from the card together with its component.

BRIEF DESCRIPTION OF THE DRAWINGS

Other characteristics and advantages of the invention appear more clearly on reading the following description of various embodiments of the invention given by way of non-limiting example.

The description the accompanying drawings, in which:

FIG. 1 above is a perspective view of a connector having angled contact terminals;

FIGS. 2a to 2c, as described above, show different configurations through holes in a printed card;

FIG. 7 is an overall perspective view of a complete modular apparatus for mounting component terminals.

MORE DETAILED DESCRIPTION

With reference initially to FIGS. 3 to 6, the principle on which the component-mounting apparatus is based will be described.

The mounting apparatus is essentially constituted by a guide element 30 in the form of a comb.

The element 30 is made up of teeth 32 which are parallel to one another and parallel to the X direction. The teeth are separated by slots 34. The distance between centers e of two consecutive teeth is naturally equal to the pitch p between two consecutive plated-through holes in the Y direction.

In order to facilitate installing angled terminals between the teeth 32, the free ends of the teeth are chamfered at 36.

Figure 3:
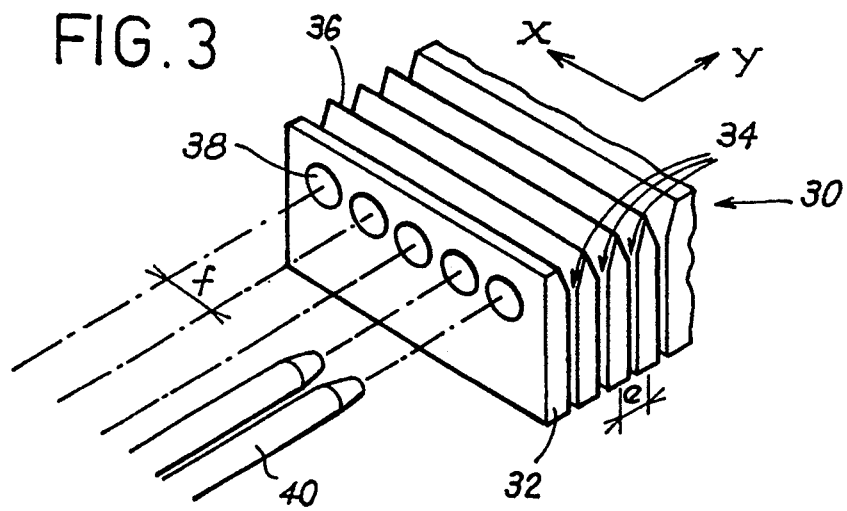
FIG. 3 is a perspective view of a portion of a comb-forming assembly.

As can be seen more clearly in FIG. 3, the teeth are provided with orifices 38 disposed slightly below their chamfered ends 36. The corresponding orifices in the teeth are aligned along the Y direction. The distance between centers f of two adjacent holes is equal to the pitch q of the plated-through holes in the X direction.

The guide element 30 also has elongate elements in the form of rods 40 suitable for being inserted in the aligned orifices 38 in the teeth. In a preferred embodiment, the ends of the rods 40 taper somewhat in order to facilitate insertion of the rods in the orifices 38. It will be understood that when the set of rods 40 have been inserted into the orifices 38 of the teeth 32, the resulting structure defines a grid of guide elements having respective pitches p and q.

Figure 6:
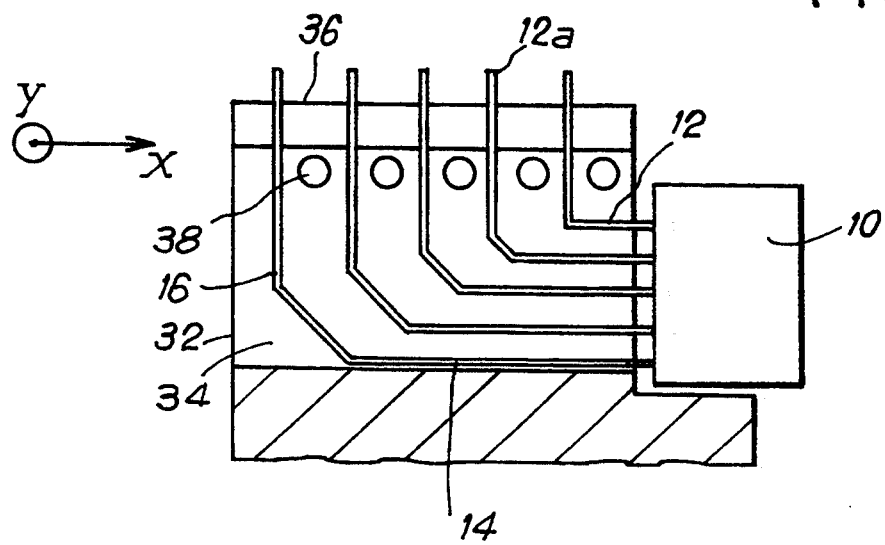

FIG. 6 shows how angled terminals of a connector are installed in the guide assembly. The connector body 10 is placed along one of the sides of the guide assembly 30. The various angled terminals 12 of the connector extending in the same X direction all penetrate into the same slot 34 between two consecutive teeth 32. As a result, the set of terminals penetrates into the set of slots 34 of the guide assembly 30.

As can be seen in FIG. 6, the orifices 38 are disposed close to the free edges 36 of the teeth so that the orifices 38 are all disposed above first portions 14 of the angled contact terminals 12 when the terminals are in place in the slots. Thereafter, the rods 40 are inserted into the sets of orifices 38. The depth of the slots 34 is designed so that after the connector has been installed, the ends 12a of the contact terminals project a little above the free edges 36 of the teeth. It will thus be understood that the ends 12a of the contact terminals are held and guided by co-operation between the teeth 32 and the rods 40.

Figure 5:
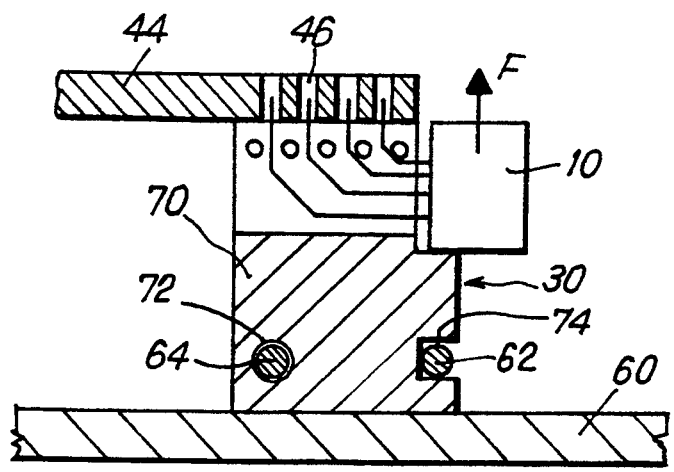
FIGS. 5 and 6 are vertical section views showing different stages in the installation of angled terminals in the comb-forming assembly and installation of the printed card relative to the mounting apparatus.

As shown in FIG. 5, in the following stage, the printed card 44 onto which the connector 10 is to be mounted is positioned relative to the guide assembly 30 by means that are described below. Because of this positioning, the plated-through holes 46 of the printed card 44 face the ends 12a of the angled terminals. These ends project a short way into the plated-through holes 46.

In the following stage, the rods 40 are extracted from the orifices 38. It is then possible to lift the entire connector in the direction of arrow F, perpendicularly to the plane of the printed card 44 so that the ends 12a of the contact terminals penetrate fully into the plated-through holes 46. It then remains merely to secure the connector body mechanically to the printed card in order to terminate mounting.

With reference now to FIG. 7, there follows a detailed description of a complete mounting apparatus. This apparatus differs from previously described apparatus essentially in that it is modular. More precisely, the guide assembly is made up of a plurality of modules suitable for being assembled together so as to match the length in the Y direction of the guide assembly to the corresponding length of the connector or other component that is to be mounted on the printed card.

The mounting tool comprises a baseplate 60 on which guide rods 62 and 64 are mounted by means of a fixed support 66. The rods 62 and 64 are parallel to the Y direction. The tool also includes a plurality of guide assemblies 30a, 30b, 30c, and 30d which are identical to the guide assembly 30 shown in FIGS. 5 and 6. Each of them has teeth 32 and orifices 38. They are of different lengths in the Y direction. The body 70 of each assembly 30 is provided with a longitudinal groove 72 and with a longitudinal hole 74. While the tool is being prepared, the guide assemblies 30a, 30b, 30c, and 30d are engaged on the guide rods 62 and 64 which penetrate into the groove 72 and the hole 74. The number of modules mounted on the baseplate 60 and their respective lengths are adapted to the length of the connector 10 which is to be mounted on the printed card 44. When the assemblies 30 are mounted on the baseplate 60, all of the orifices 38 are in alignment in the Y direction. An intermediate support 76 provided with a rod 78 for positioning the card 44 is also engaged between the rods 62 and 64, as is a removable end support 80. When the appropriate elements have been engaged between the rods 62 and 64, the rods are secured by locking means (not shown) that may be constituted by a screw. The tool is then ready for use and it is adapted to the length of the connector 10 to be mounted on the card 42.

Initially, the connector 10 is mounted on the tool so that the contact terminals penetrate into the slots 34 of the guide assemblies 30a, 30b, 30c, and 30d. Initial guidance is obtained by co-operation between the guide rod 78 of the part 76 and a fixing orifice for fixing the connector 10 on the card, said orifice disposed on the rear face of the connector not being visible in the figure. The connector is pushed home until it comes into bottom abutment on the body 70 of the guide elements 30a, 30b, 30c, and 30d. The contact terminals of the connector are then in the position shown in FIG. 6.

In the next stage, the rods 40 are inserted in the aligned orifices of the teeth 32 of the guide elements 30a, 30b, 30c, and 30d. To facilitate insertion of the rods 40, they are mounted in a sliding cursor 90. At the beginning of insertion, the cursor 90 is close to the ends 42 of the rods 40. As the rods are inserted in the orifices 38, the cursor is pushed back by the end face of the first guide assembly. When the two sets of rods 40 have been fully inserted, the ends 12a of the contact terminals 12 are suitably guided.

The card 44 then needs to be positioned relative to the tool, i.e. relative to the connector. Initially this positioning is achieved by co-operation between the rod 78 and the orifice of the part 94 inserted in the fixing hole of the card and designed to adapt the diameter of the hole in the card to the diameter of the rod 78. Nevertheless, this leaves the card 42 free in the Z direction orthogonal to the X and Y directions, i.e. orthogonal to the plane of the card. Rotation is prevented by means of positioning elements 92 engaged at the ends of the connector, for example. These elements 92 come into abutment against the edge of the card 44 when the card is lowered. The card 44 is lowered in the Z direction, thereby enabling each contact terminal end to penetrate into the corresponding plated-through hole 46. Thereafter the card positioning elements 92 are withdrawn.

After that, the two series of rods 40 are withdrawn from the guide assemblies 30a, 30b, 30c, and 30d. After that, by tightening screws for fixing the connector to the card 42 (not shown), the connector is moved towards the card, thereby fully inserting the ends of the contact terminals 12 in the plated-through holes 46 of the card 44. Connector mounting is thus terminated. All that remains to be done is remove the card-connector assembly from the tool.

Figure 8:
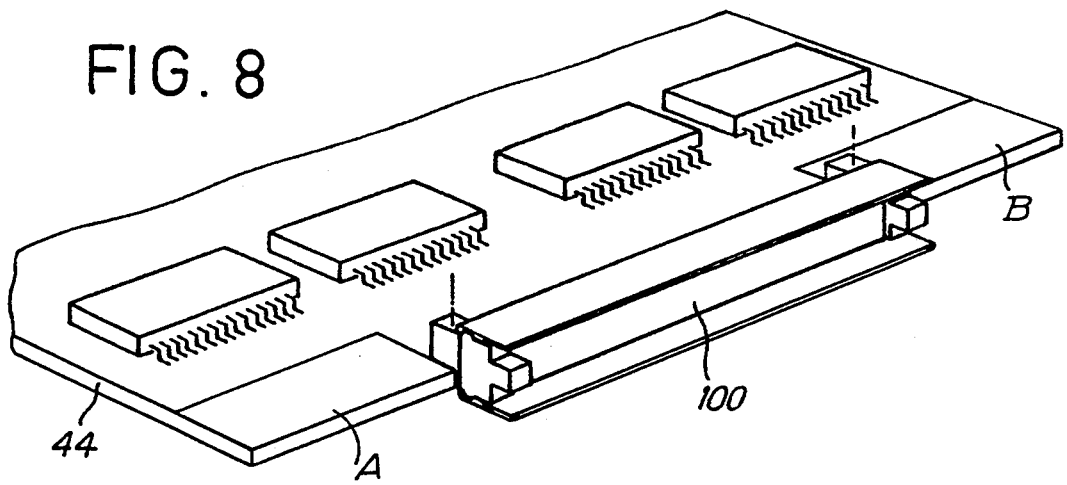
FIG. 8 shows one particular way in which components may be mounted on a printed card.
Figure 4:
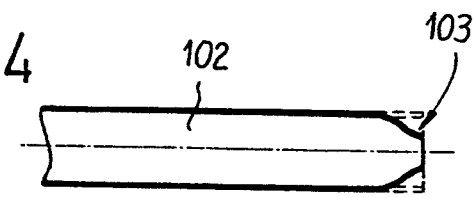
FIG. 4 is a fragmentary view of an elongate element of the apparatus.

It will be understood that inserting the rigid rods 40 into the guide assemblies 30 is possible only if the zones on the card facing the ends of the connector do not have any components. FIG. 8 shows a case in which the zones A and B disposed at the ends of the connector 100 to be mounted are occupied by components. In this case, the rigid rods 40 are replaced by flexible tubes 102 visible in FIG. 7. These tubes 102 are sufficiently flexible to adapt to the presence of components in the zones A and B of the card. In order to facilitate insertion thereof, the ends of the tubes 102 taper at 103, as can be seen in FIG. 4. Once they have been inserted, the tubes 102 perform the same role of guiding the ends of the connection terminals as the rigid rods 40.

We claim:

1. A method of mounting an electronic component having a plurality of angled terminals onto a printed card having plated-through holes, said angled terminals having ends disposed in parallel rows and columns, said terminals extending in a column direction and being intended to be received in respective ones of said holes, the method comprising positioning terminals disposed in the same columns in corresponding parallel slots of a guide assembly, said slots being separated by parallel teeth, the terminals being positioned such that the ends of the terminals project beyond ends of said teeth;

inserting elongate elements in a plurality of aligned orifices formed in said teeth such that said elongate elements extend between adjacent terminals in the same column;

positioning said guide assembly relative to said card such that said terminal ends penetrate, at least in part, into said plated-through holes;

withdrawing said elongate elements from said orifices;

displacing said card relative to said component perpendicular to a plane defined by said card so as to cause the ends of said terminals to penetrate fully into said plated-through holes;

securing said component to the card; and separating said guide assembly from the card and said component.

2. A mounting apparatus for mounting angled terminals of electronic components in plated-through holes of a printed card, the ends of the terminals being disposed in parallel rows and columns, said terminals extending in a column direction, the mounting apparatus comprising:

a comb-forming guide assembly including a plurality of mutually parallel teeth defining slots between one another, each slot being suitable for receiving terminals in a same column, each tooth being provided with a plurality of orifices with corresponding one of said orifices being in alignment in a row direction; and a plurality of elongate elements, each elongate element being adapted to be inserted into a respective one of said orifices with each elongate element being disposed between a terminal of one column and an adjacent terminal in the same column, whereby the end of each terminal is surrounded, when all of said terminals are installed in said guide assembly, by portions of two adjacent teeth and by portions of two adjacent elongate elements.

3. The mounting apparatus according to claim 2, wherein said guide assembly further includes a plurality of guide modules each constituted by a body, a baseplate, and means for securing said guide modules on said baseplate.

4. The mounting apparatus according to claim 2, wherein said elongate elements are rigid rods.

5. The mounting apparatus according to claim 2, wherein said elongate elements are flexible tubes.

6. The mounting apparatus according to claim 3, wherein said elongate elements are rigid rods.

7. The mounting apparatus according to claim 3, wherein said elongate elements are flexible tubes.

* * * * *